United States Patent
Patel et al.

(10) Patent No.: US 7,110,160 B2
(45) Date of Patent: Sep. 19, 2006

(54) ELECTRICAL CONTACTS IN MICROELECTROMECHANICAL DEVICES WITH MULTIPLE SUBSTRATES

(75) Inventors: Satyadev Patel, Sunnyvale, CA (US); Peter Richards, San Francisco, CA (US); Jonathan Doan, Mountain View, CA (US); Terry Tarn, San Diego, CA (US)

(73) Assignee: Reflectivity, INC, Sunnyvale, CA (US)

( * ) Notice: Subject to any disclaimer, the term of this patent is extended or adjusted under 35 U.S.C. 154(b) by 0 days.

(21) Appl. No.: 11/102,082

(22) Filed: Apr. 8, 2005

(65) Prior Publication Data

US 2005/0275931 A1 Dec. 15, 2005

Related U.S. Application Data

(63) Continuation-in-part of application No. 10/869,539, filed on Jun. 15, 2004.

(51) Int. Cl.
*G02B 26/00* (2006.01)
*G02B 26/08* (2006.01)

(52) U.S. Cl. .............. 359/295; 359/291; 359/298

(58) Field of Classification Search ........ 359/290–292, 359/295, 298, 223, 224, 855
See application file for complete search history.

(56) References Cited

U.S. PATENT DOCUMENTS

| | | | |
|---|---|---|---|
| 4,935,086 A * | 6/1990 | Baker et al. ............... | 156/246 |
| 5,835,256 A | 11/1998 | Huibers | |
| 5,999,306 A * | 12/1999 | Atobe et al. ............... | 359/295 |
| 6,046,840 A | 4/2000 | Huibers | |
| 6,396,619 B1 | 5/2002 | Huibers et al. | |
| 6,523,961 B1 | 2/2003 | Ilkov et al. | |
| 6,529,310 B1 | 3/2003 | Huibers et al. | |
| 6,731,420 B1 * | 5/2004 | Orcutt et al. ............... | 359/223 |
| 6,844,959 B1 | 1/2005 | Huibers et al. | |
| 6,873,450 B1 | 3/2005 | Patel et al. | |
| 6,885,494 B1 | 4/2005 | Patel et al. | |
| 2004/0145089 A1* | 7/2004 | Burrows ..................... | 264/496 |
| 2005/0231792 A1* | 10/2005 | Alain et al. ................ | 359/291 |

OTHER PUBLICATIONS

Klosterman, et al, Materials Characterization, Conduction Development, and Curing Effects on Realiability of Isotropically Conductive Adhesives, 1998 IEEE, pp. 23-31.

John Gould, TechnologyWatch Mini Briefing, Polymer Electronics, 2004, pp. 1-6.

* cited by examiner

*Primary Examiner*—Loha Ben
*Assistant Examiner*—Jack Dinh
(74) *Attorney, Agent, or Firm*—Gregory R. Muir

(57) ABSTRACT

Disclosed herein a microelectromechanical device having first and second substrates that are bonded together with a gap formed therebetween. A plurality of functional members is disposed within the gap. The two substrates are bonded with a bonding agent that comprises an electrically conductive adhesive material.

45 Claims, 9 Drawing Sheets

ELECTRICAL CONTACTS IN MICROELECTROMECHANICAL DEVICES WITH MULTIPLE SUBSTRATES

CROSS-REFERENCE TO RELATED CASES

The present patent application is a continuation-in-part of U.S. patent application Ser. No. 10/869,539 filed Jun. 15, 2004, the subject matter being incorporated herein by reference in entirety.

TECHNICAL FIELD OF THE INVENTION

The present invention is related generally to the art of microelectromechanical systems, and, more particularly, to micromirror array device package having an array of micromirrors.

BACKGROUND OF THE INVENTION

In microelectromechanical devices having multiple substrates, functional elements are often fabricated on separate substrates. For example, in a micromirror array device having two substrates, deflectable reflective mirror plates can be fabricated on a light transmissive substrate, while the addressing electrodes can be fabricated on a semiconductor substrate. The light transmissive substrate and the semiconductor substrate are bonded together such that the deflectable reflective mirror plates can be individually addressed and deflected by the addressing electrodes. Because of the complexity and delicateness of the functional members of the device, it is often desired to extend the electrical contact of the functional members in an area away from the space wherein the delicate functional members are disposed. From the extended electrical contacts, external power sources and signals sources (e.g. data signals and control signals) can be transferred into the functional members.

Therefore, what is needed is a method and apparatus for providing electrical contacts to the microelectromechanical devices having multiple substrates.

SUMMARY OF THE INVENTION

In an embodiment of the invention, a microelectromechanical (MEMS) device having multiple substrates are provided. Functional members of the MEMS device are enclosed within a space between first and second substrates. The first and second substrates are bonded together with a bonding agent that comprises a conductive epoxy. The conductive epoxy not only bonds the first and second substrates, but also provides an electrical contact to the MEMS device. In particular, the conductive epoxy provides an electrical contact to the functional members of the MEMS device in one of the first and second substrates, and extends such electrical contacts into electrical contact pads that are deployed in an area away from the space wherein the functional members of the MEMS device are disposed. External power sources and signals sources (e.g. data and control signal sources) can be directly connected to such extended electrical contact pads.

In addition to the electrical conducting epoxy, the bonding agent may also comprise a non-conductive epoxy for enhancing the bonding of the first and second substrates.

The objects of the invention are achieved in the features of the independent claims attached hereto. Preferred embodiments are characterized in the dependent claims.

BRIEF DESCRIPTION OF DRAWINGS

While the appended claims set forth the features of the present invention with particularity, the invention, together with its objects and advantages, may be best understood from the following detailed description taken in conjunction with the accompanying drawings of which:

DETAILED DESCRIPTION OF THE EMBODIMENTS

The present invention provides a microelectromechanical device comprising multiple substrates with the functional components of the device disposed between substrates. The substrates are bonded together with a bonding agent that comprises an electrical conducting epoxy. The electrical conducing epoxy can be obtained by filling a regular non-electrical conductive epoxy with a conducting material, such as silver, gold, and carbon. The electrical contacts of the functional members in one of the multiple substrates are electrically connected to the conductive bonding material and extended into electrical contact pads that are deployed in an area away from the space wherein the functional members of the device are disposed. External power sources and signals sources (e.g. data and control signals) can be transferred to the functional members through the contacting pads and conductive bonding material.

In the following the present invention will be discussed with references to micromirror array devices each comprising a mirror substrate and electrode substrate that is bonded to the mirror substrate. It will be appreciated by those skilled in the art that the following discussion is for demonstration purposes only, and should not be interpreted as a limitation. Instead, many other variations without departing from the spirit of the invention are also applicable. In particular, the present invention is applicable to other microelectromechanical devices with multiple substrates that are bonded together.

Figure 1:
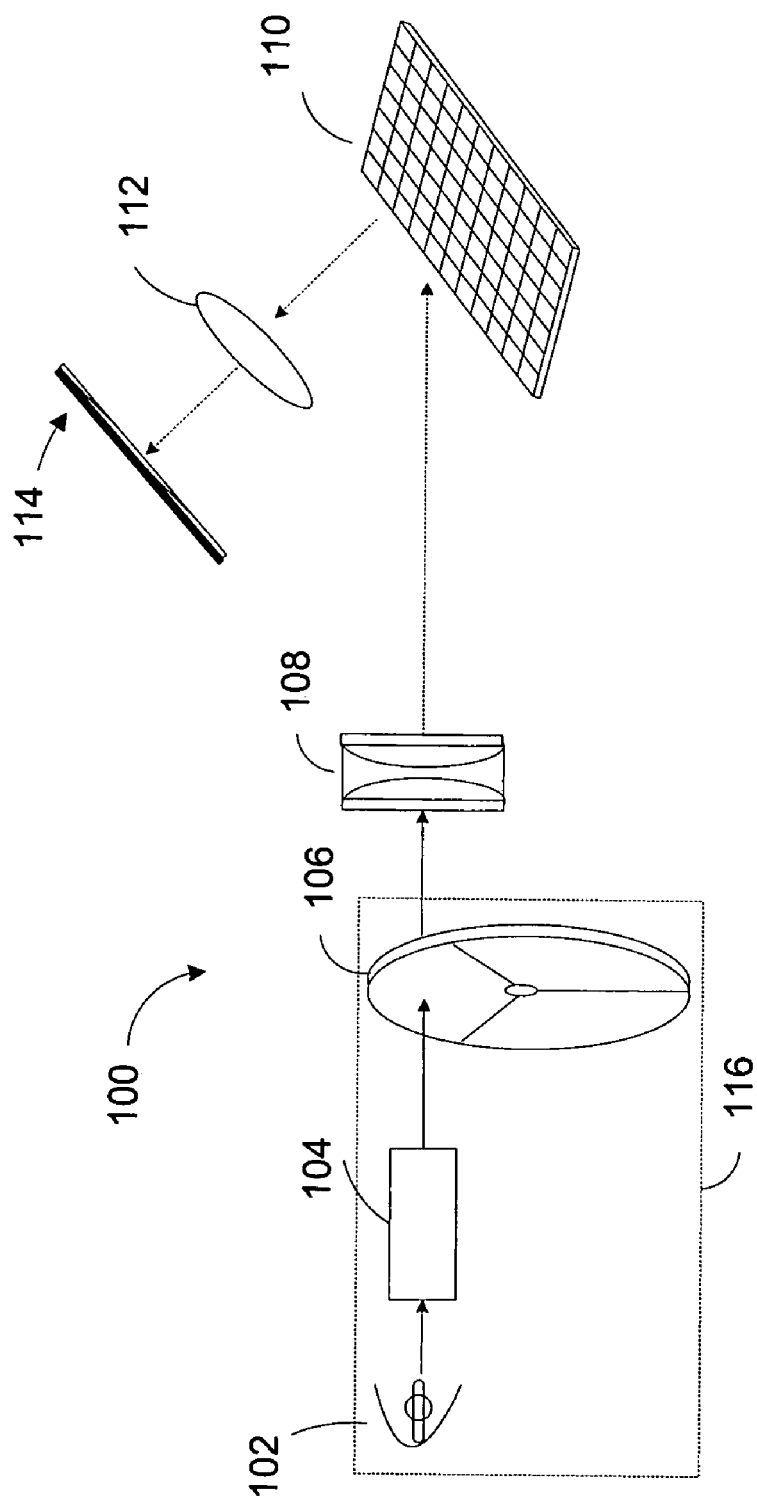
FIG. 1 illustrates an exemplary display system having a spatial light modulator in which embodiments of the invention can be implemented.

Turning to the drawings, FIG. 1 illustrates an exemplary digital display system employing a spatial light modulating having an array of micromirrors in which embodiment of the invention can be implemented. Referring to FIG. 1, display system 100 comprises illumination system 116 for producing sequential color light, spatial light modulator 110 that comprises an array of micromirrors, optical element 108 for directing illumination light from the illumination system onto spatial light modulator 110, and optical element 112 that projects the reflected illumination light onto display target 114.

Illumination system 116 further comprises light source 102, which can be an arc lamp, lightpipe 104 that can be any suitable integrator of light or light beam shape changer, and color filter 106, which can be a color wheel. The filter in this particular example is positioned after light pipe 104 at the propagation path of the illumination light. In another example, the color filter can be positioned between the light source and light pipe 104, which is not shown in the figure.

Figure 2:
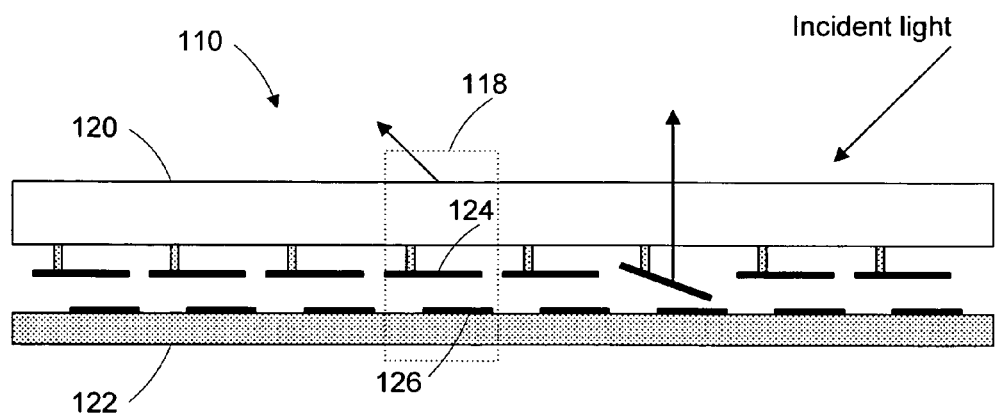
FIG. 2 illustrates a cross-section view of a portion of an array of micromirrors in the spatial light modulator of FIG. 1.

FIG. 2 illustrates a cross-section view of an exemplary spatial light modulator in FIG. 1. For simplicity purposes, only eight micromirror devices are illustrated therein. In general, the micromirror array of a spatial light modulator consists of thousands or millions of micromirrors, the total number of which determines the resolution of the displayed images. For example, the micromirror array of the spatial light modulator may have 1024×768, 1280×720, 1400× 1050, 1600×1200, 1920×1080, or even larger number of micromirrors. In other applications, the micromirror array may have less number of micromirrors.

In this example, the array of deflectable reflective mirror plates (e.g. 124) is disposed between light transmissive substrate 120 and semiconductor substrate 122 having formed thereon an array of addressing electrodes (e.g. addressing electrode 126) each of which is associated with a mirror plate for electrostatically deflecting the mirror plate. In operation, the illumination light passes through the light transmissive substrate and illuminates the reflective surfaces of the mirror plates, from which the illumination light is modulated. The reflected illumination light from the mirror plates at the ON state is collected by the projection lens (e.g. projection lens 112 in FIG. 1) so as to generate a "bright" pixel in the display target (e.g. display target 114 in FIG. 1). The reflected illumination from the mirror plates at the OFF state travels away from the projection lens, resulting in the corresponding pixels in the display target to be "dark."

The micromirrors in the array can be arranged in many suitable ways. For example, the micromirrors can be arranged such that the center-to-center distance between the adjacent mirror plates can be 10.16 microns or less, such as 4.38 to 10.16 microns. The nearest distance between the edges of the mirror plate can be from 0.1 to 1.5 microns, such as from 0.15 to 0.45 micron, as set forth in U.S. patent application Ser. No. 10/627,302, Ser. No. 10/627,155, and Ser. No. 10/627,303, both to Patel, filed Jul. 24, 2003, the subject matter of each being incorporated herein by reference.

Figure 3:
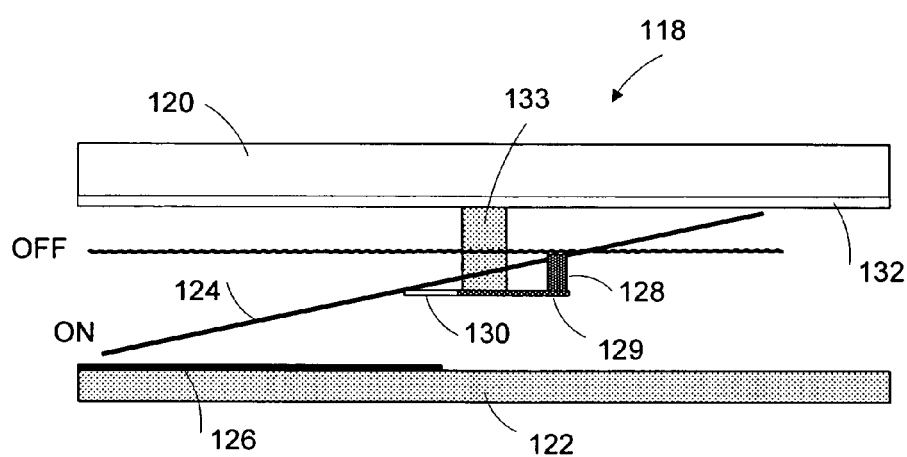
FIG. 3 is an exploded cross-sectional view of a micromirror device of the micromirror array in FIG. 2.

As a way of example, an exemplary micromirror in FIG. 2 is schematically illustrated in a cross-section view in FIG. 3. Referring to FIG. 3, micromirror 118 comprises deflectable mirror plate 124 having a reflective surface for reflecting the illumination light to be modulated. The mirror plate is attached to deformable hinge 129 (e.g. a torsion hinge) via hinge contact 128 with the deformable hinge being held and supported by post 133 on substrate 120 such that the mirror plate can be deflected (rotated) relative to the substrate. The deflection of the mirror plate is achieved by electrostatic field established between the mirror plate and addressing electrode 126.

According to the invention, the light transmissive substrate 120 comprises an electrode (e.g. electrode 210) for pulling the mirror plate towards the light transmissive substrate. This electrode on the light transmissive substrate is transmissive to the incident light. Specifically, the electrode transmits 90% or more, or 99% or more of the incident light (e.g. visible light). The electrode can be formed as a film, a strip, a grid, or a set of discontinuous segments, as set forth in U.S. patent application Ser. No. 10/437,776 filed May 13, 2003, and Ser. No. 10/947,005 filed Sep. 21, 2004, the subject matter of each being incorporated herein by reference in entirety.

In accordance with an embodiment of the invention, only one addressing electrode 126 is provided for the micromirror for switching the mirror plate between the ON and OFF state according to the image data of the desired image to be produced by the system. Of course, multiple addressing electrodes can be provided for each micromirror, which will not be discussed in detail herein.

Stopper 130 can be provided as an alternative feature to limit the rotation of the mirror plate in accordance with the operation states, such as the ON state when the micromirror is operated in a binary mode including the ON and OFF state. The stopper 130 can be formed in many alternative ways, such as those set forth in U.S. patent application Ser. No. 10/437,776 filed Apr. 13, 2003 and Ser. No. 10/613,379 filed Jul. 3, 2003, Ser. No. 10/703,678 filed Nov. 7, 2003, the subject matter of each being incorporated herein by reference.

In operation, the mirror plate switches between the ON and OFF state according to the image data so as to reflect the incident light into different directions. As an example, the mirror plate is rotated to the ON state by setting the electrical voltage on the addressing electrode 126 to a value such that the rotation torque derived from the voltage difference between the mirror plate and the addressing electrode is sufficient enough to overcome the total resisting torque including the mechanical torque in the deformable hinge and the electrical torque derived from the voltage difference between the mirror plate and the electrode 210 on the light transmissive substrate. When the voltage difference between the mirror plate and addressing electrode is removed, or reduced to a value that can not balance the total resisting torque including the mechanical torque of the deformed hinge and the electrical torque derived from the voltage difference between the mirror plate and electrode 210 on the light transmissive substrate, the mirror plate rotates towards the OFF state.

Because of the complexity and delicateness of the functional members (e.g. the mirror plates, hinges, addressing electrodes and the circuitry associated with the addressing electrodes), electrical connection to the functional members are preferably extended into an area away from the space in which the functional members are disposed. An exemplary configuration of electrical contact is illustrated in FIG. 4.

Figure 4:
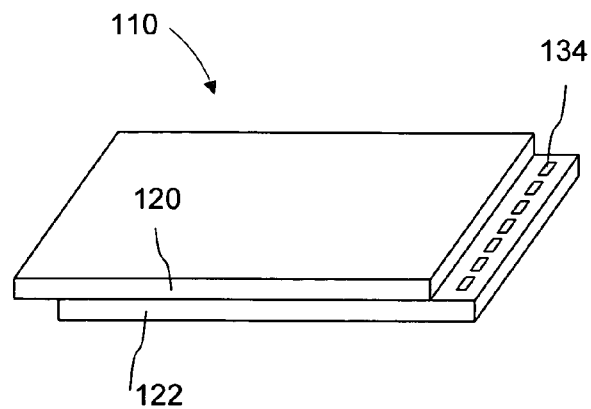
FIG. 4 is a perspective view of an exemplary micromirror assembly having an array of micromirror devices in FIG. 2.

Referring to FIG. 4, substrate 120 having an array of deflectable reflective mirror plates are assembled with substrate 122 having an array of addressing electrodes and circuitry. The two substrates are assembled in a way such that the assembly has a ledge on one of the two substrates (e.g. in substrate 122 in this example). The ledge, instead of being enclosed in the space (e.g. the space between the two substrate) in which the functional members are disposed, is outside the space and exposed to environment. A set of electrical contacting pads 134 is deployed on the ledge. With such configuration, external power sources and signal sources, such as data and control signal sources can be easily connected to the electrical contacting pads, through which the external power sources and signals can be transferred to the functional members enclosed within the space between the two substrates of the device.

Figure 5:
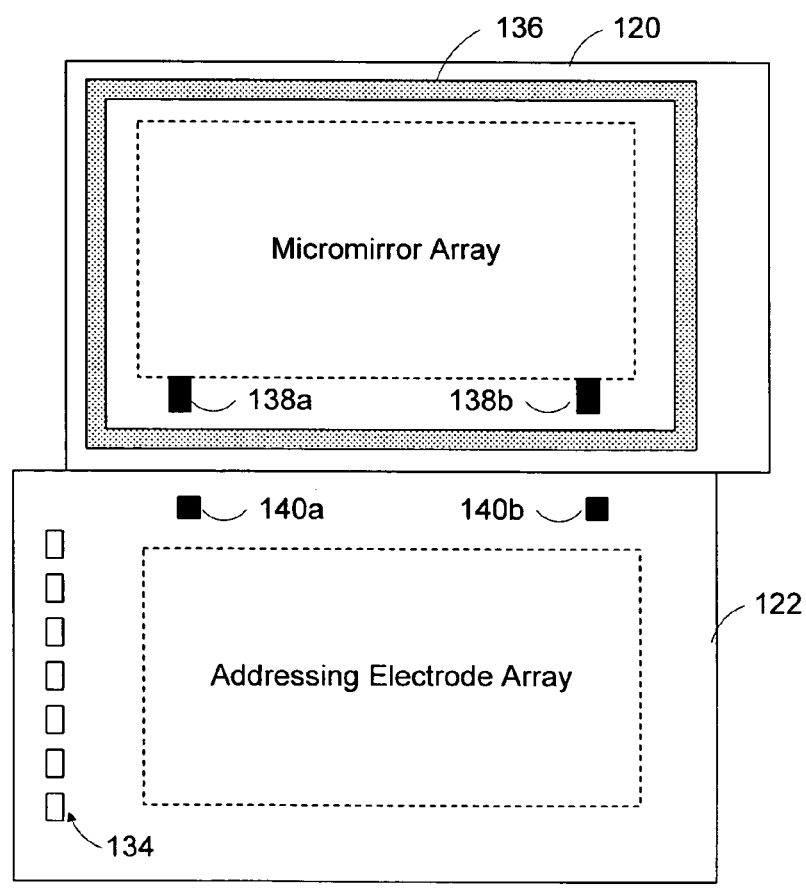
FIG. 5 is a top view of an exemplary configuration of the electrical contacts on the first and second substrates of a micromirror array device.

There are many ways to extend the electrical contact of the enclosed functional members to the electrical contacting pads 134 on the assembly ledge. FIG. 5 illustrates one example. Referring to FIG. 5, substrate 120 having thereon the array of deflectable reflective mirror plates comprises a bonding pad 138a that is electrically conductive. Substrate 122 having formed on an array of addressing electrodes and circuitry comprises a bonding pad 140a that is electrically conductive. The bonding pads 138a and 140a are located such that when substrates 120 and 122 are bonded together in assembling, bonding pads 138a and 140a are aligned and bonded together so as to bond the two substrates. Bonding pad 138a is electrically connected to the functional members on the substrate 120, and bonding pad 140a is electrically connected to one of more electrical contacting pads 134. Because the bonding pads 138a and 140a are electrically conductive, electrical contact of the functional members on substrate 120 can thus be extended to bonding pad 140a, through which the electrical contact of the functional members in substrate 120 can be further extended to the assigned electrical contacting pads in 134.

The electrically conductive bonding pads 138a and 140a may have any suitable shapes, such as pads, strips, frames, and segments. And these bonding pads can be positioned at any desirable locations on substrates 120 and 122. For example, bonding pad 138a can be positioned outside or even inside the micromirror array area on substrate 120. If bonding pad 138a is positioned within the micromirror area, the corresponding bonding pad 140a will be located inside the area of the addressing electrodes on substrate 122. In an embodiment of the invention, the bonding pad 138a is disposed in a location outside the area of the micromirrors, but is enclosed in an area circumferenced by another bonding material 136. In particular, bonding material 136, that is preferably non-electrical conductive, is provided to bond substrate 120 and 122. Bonding material 136 may or may not be deposited on substrate 120. However, when the two substrates 120 and 122 are bonded together, the electrically conductive bonding pads 138a and 140a are preferably enclosed within the area circumferenced by the bonding material 136.

The electrically non-conductive bonding material 136 may have any desired shapes. Even though it is shown in the figure that the bonding material 136 is deposited along the circumference of substrate 120, and forms a continuous ring with the micromirrors and bonding pad 138a (as well as 140a) enclosed therein, this is not an absolute requirement. Instead, other configurations are also applicable. For example, the bonding material 136 can be segments, frames, and grids deposited on suitable locations of substrate 120 (and/or substrate 122). Alternatively, the bonding material 136 can be formed as pads. If the two substrates 120 and 122 are desired to be hermetically bonded, the bonding material 136 is then desired to be a continuous ring such that when the two substrates 120 and 122 are hermetically bonded together, the functional members (e.g. the mirror plates and addressing electrodes) are fully enclosed within the area circumferenced by the bonding ring 136, as shown in the figure.

In addition to the electrical bonding pads 138a and 140a, other electrical bonding pads, such as 138b and 140b can be provided in the same way as the electrical bonding pads 138a and 140a. According to an embodiment of the invention, electrical bonding pads 138a and 140b can be configured independent from any other electrical bonding pads, including bonding pads 138a and 140a, in many aspects, such as material, geometric shape, and location. The bonding pads 138a 138b, 140a, and 140b can be used to electrically connect any different functional members on substrate 120. For example, bonding pad 138a and 138b can be used to electrically connect the same functional member, such as all reflective deflectable mirror plates of an array of micromirrors formed on substrate 120. Alternatively, bonding pads 138a and 138b can be used to electrically connect different functional members. For example, bonding pad 138a can be used to electrically connect a thin film transparent electrode on substrate 120, while pad 138b can be used to electrically connect all reflective deflectable mirror plates of the micromirrors on substrate 120, as set forth in US patent application "Optical Coating on Light Transmissive Substrates of Micromirror Devices", attorney docket number P225-US, the subject matter being incorporated herein by reference in entirety.

The electrical bonding pads 138a, 138b, 140a, and 140b may comprise many suitable materials. In accordance with an embodiment of the invention, the electrical bonding pad comprises an electrical conductive adhesive. Such conductive adhesive is preferably low outgassing, and can be a conductive epoxy. Specifically, the electrically conductive epoxy can be a standard epoxy filled with an electrically conductive material, such as, but not limited to, metal elements (e.g. silver and gold), metalloids, intermetallic materials, or other material such as carbon which by filling the standard epoxy results in a conductive epoxy, or carbides of metal elements, metalloids, intermetallic materials, and ceramics. The conductive adhesive may also comprise an electrically conductive organic (or polymer) material or an electrically non-conductive organic (or polymer) material filled with a conductive material.

The substrate (e.g. substrate 120) having the reflective deflectable mirror plates formed thereon is then bonded to the substrate (e.g. substrate 122) having the addressing electrodes and circuitry formed on using the bonding agent that comprises an electrically conductive bonding material (e.g. electrically conductive bonding pads 138a and 140a), and a electrically non-conductive bonding material such as electrically non-conductive bonding material 136). The bonding process can be performed in many ways according to the specific bonding agent used. As a way of example, the electrical conductive bonding material is an epoxy filled with an electrically conductive material such as gold, silver, and carbon, and the electrically non-conductive bonding material is a regular epoxy. Substrates 120 and 122 are aligned such that the deflectable reflective mirror plates are associated with the addressing electrodes, and the bonding pads (e.g. 138a and 140a) are aligned together. The bonding agent is then cured at selected temperatures so as to achieve desired bonding, such as hermetic bonding. For example, the substrates and the bonding agent are cured at a temperature of from 70° C. to 300° C., or around 140° C. The bonded and hermetically sealed substrates are then cooled down, for example, to a temperature below 100° C., such as 70° C. It is preferred that the bonded substrates are cooled down to a temperature such that the pressure inside the hermetically sealed space between the substrates after cooling (e.g. to the room temperature) is below the atmosphere, such as 500 Torr or lower, or 200 Torr or lower, or 100 Torr or lower. The reduced pressure between the bonded and hermetically sealed substrates is of great importance when the micromirror array device is operated in a typical operation environment of room temperature and at 1 atmosphere. Specifically, the reduced pressure between the substrates can prevent increase of the gap between the substrates due to outwards expansion of the substrates in the presence of temperature variation. For this reason, the pressure inside the hermetically sealed package can be of any pressure below one atmosphere, such as 250 Torr or less, or 50 Torr or less, or 10 Torr or less, or 1 Torr or less, or 100 mTorr or less. The low pressure inside the hermetically sealed package can also be obtained through many other ways, such as sealing the package within a low pressure chamber.

In accordance with an embodiment of the invention, the bonding and sealing of the substrate can be performed in a pressured chamber. During the bonding and sealing, the volume between the two substrates decreases, resulting in increase of pressure between the substrates. This pressure variation may burst the sealing material between the substrates. For this and other reasons, the bonding and sealing of the substrates are performed within a chamber that has a pressure proximate to the internal pressure of the seal gap between the substrates. In this way, the pressure between the substrates during the bonding and sealing is in equilibrium with the environment pressure.

During or right before the bonding, the bonding agent can be cured with UV (or IR) light when the bonding agent comprises UV (or IR) curable epoxy. After such curing, the two substrates are bonded with optional external pressure applied.

The bonded and hermetically sealed substrates, referred to as an assembly, can be processed further, such as being packaged for protection, which will not be discussed in detail herein.

Figure 6:
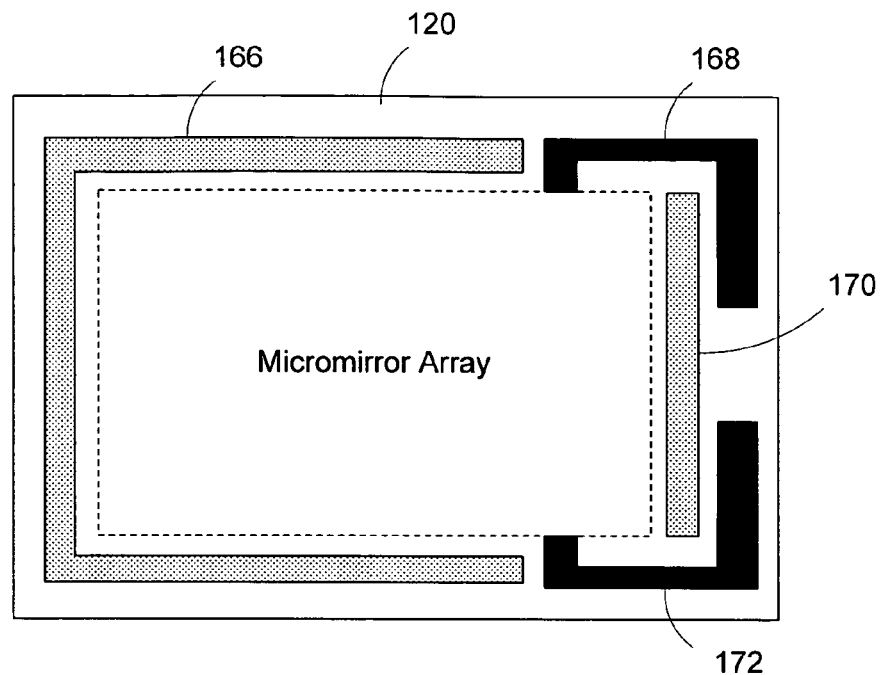
FIG. 6 is a top view of another exemplary configuration of the bonding agent in the substrate having the deflectable mirror plates.
Figure 7:
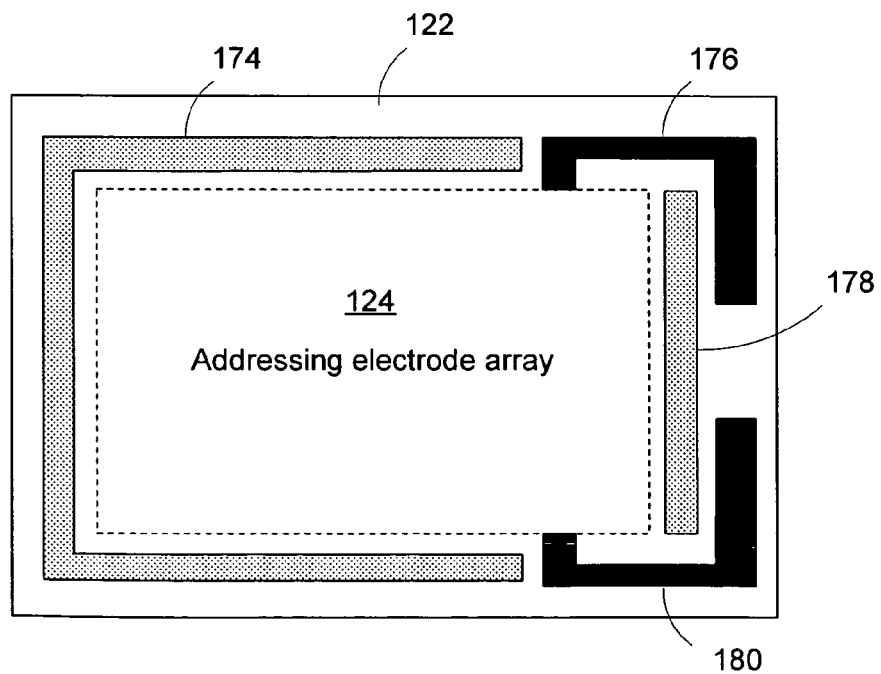
FIG. 7 is a top view of another exemplary configuration of the bonding agent in the substrate having the addressing electrodes.

In addition to the configuration of the electrical contact as shown in FIG. 5, other types of configurations are also applicable, such as that in FIG. 6 and FIG. 7. Referring to FIG. 6, substrate 120 having the micromirror is to be hermetically bonded to substrate 122 (in FIG. 7) having the addressing electrodes with a bonding agent that comprises electrically non-conductive sealing ring 166 (e.g. regular epoxy) and an electrically conductive bonding pad 168. The electrically conductive bonding pad 168 can be a regular epoxy but filled with an electrically conductive material, such as silver, gold, and carbon. The non-conductive sealing ring 166 can be deposited on substrate 120 around the circumference of the substrate but with gaps in which the electrically conductive bonding pad crosses over, as shown in the figure. When hermetic sealing of the two substrates are desired, the electrically non-conductive sealing ring and electrically conductive pad are deployed such that the gaps opened by the sealing ring is fully filled with the conductive pad, and the interior micromirror array is completely circumferenced by the sealing ring 166 and conductive pad 168.

Associated with the sealing ring 166 and conductive pad 168 on substrate 120, electrically non-conductive sealing ring 174 and electrically conductive pad 176 are deployed at appropriate locations on substrate 122 having the addressing electrodes formed thereon, as shown in FIG. 7. The two substrates 120 and 122 are then bonded together so as to form the desired bonding, such as hermetic bonding.

In the above example, electrically non-conductive sealing rings are deposited on both of the substrates 120 and 122. This is not an absolute requirement. Alternatively, only one of the two substrates is provided with the non-conductive sealing ring. Moreover, the layout patterns of the electrically conductive pads (168 in FIG. 6 and 176 in FIG. 7) may or may not be identical, especially when the two substrates are to be bonded non-hermetically.

The two substrates can then be bonded together, for example using the same or a variation bonding method as discussed above with reference to FIG. 5, which will not be discussed in detail herein.

The present invention is applicable to many types of micromirrors devices. FIG. 3 illustrates one of the many examples. Referring again to FIG. 3, the mirror plate can be attached to the deformable hinge symmetrically or asymmetrically. When the mirror plate is attached to the deformable hinge with the attachment point substantially at or around the geometric (or mass) center of the mirror plate, the mirror plate rotates symmetrically—that is, the maximum angles achievable by the mirror plate rotating in opposite directions are substantially the same. Alternatively, when the attachment point is offset from the geometric (or mass) center of the mirror plate, the mirror plate rotates asymmetrically—that is the maximum angles achievable by the mirror plate in opposite directions are different. The asymmetric rotation of the mirror plate is more advantageous in obtaining higher contrast ratio. The ON state angle of the present invention is preferably 12° degrees or more, such as 14° degrees or more, and 14° degrees or more. The OFF state can be a state where the mirror plate is parallel to the substrate on which the mirror plates are formed, such as substrate 120. The OFF state angle can be other values, such as $-1°$ degree or less, such as $-2°$ degrees or less, and $-4°$ degrees or less, wherein the minus sign "−" represents the opposite rotation direction in relation to the ON state angle. Such ON and OFF state angles can be achieved by attaching the mirror plate asymmetrically to the deformable hinge. Specifically, the hinge contact (128) contacts at the mirror plate at a location away from the geometric or mass center of the mirror plate. As a result, the deformable hinge, as well as the rotation axis is not along a diagonal of a diagonal of the mirror plate when viewed from the top of the mirror plate at the non-deflected state. Exemplary micromirrors of asymmetric rotation will be better illustrated in perspective views in FIGS. 8 to 10 afterwards.

In the cross-section view of FIG. 3, the deformable hinge and the mirror plate are in different planes. Alternatively, the mirror plate and the deformable hinge can be in the same plane. For example, the mirror plate and the deformable hinge can be fabricated or derived from a single flat substrate, such as a single crystal (e.g. single crystal silicon). Alternatively, the mirror plate and the deformable hinge can be derived from one deposited film by patterning. The stopper (e.g. stopper 130) can be in the same plane of the deformable hinge, but can also be in different planes of the deformable hinge.

In addition to the addressing electrode whose operation state (voltage) depends upon the image data of the desired image, an additional electrode for rotating the mirror plate in the direction opposite to that driven by the addressing electrode can also be provided. For example, the additional electrode can be formed on substrate 120 on which the mirror plate is formed. Alternatively, the additional electrode can be formed on the micromirror on a side opposite to the addressing electrode relative to the rotation axis of the mirror plate.

Addressing electrode 126 is preferably disposed such that the edge of the addressing electrode extending beyond the mirror plate, for example, beyond the furthest point of the mirror plate measured from the deformable hinge, so as to maximize the utilization efficiency of the electrostatic field, as set forth in U.S. patent application Ser. No. 10/947,005 filed Sep. 21, 2004, the subject matter being incorporated herein by reference. In an embodiment of the invention, each mirror plate is addressed and deflected by one single addressing electrode. In this instance, the mirror plate is rotated to the ON state by an electrostatic force derived from the electrostatic field established between the mirror plate and the addressing electrode.

Figure 8:
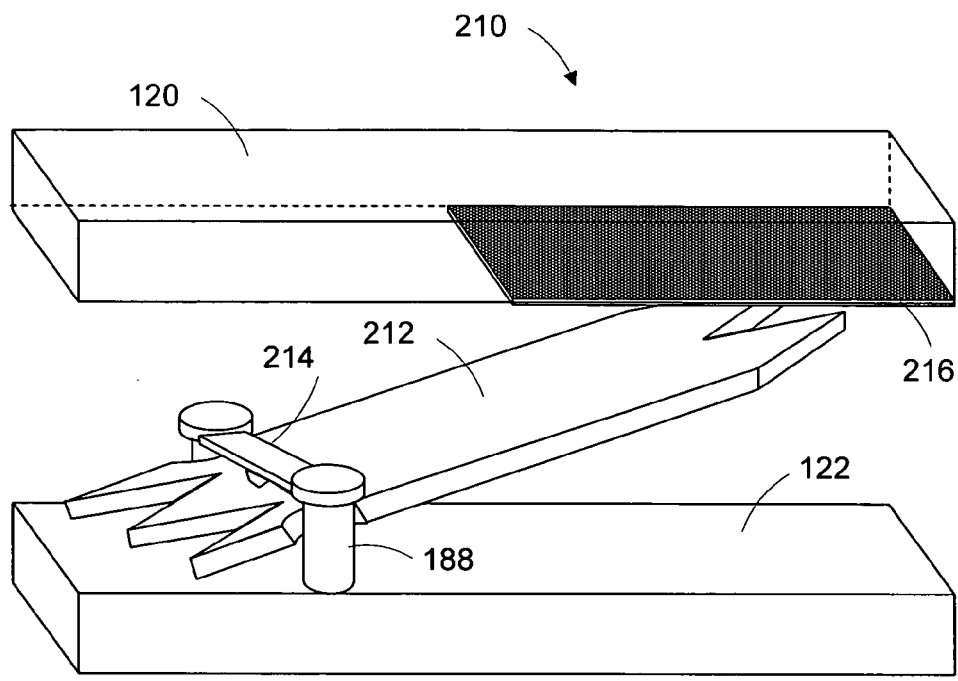
FIG. 8 is an exemplary micromirror device of the micromirror array device in FIG. 3 according to an embodiment of the invention.

Referring to FIG. 8, a perspective view of an exemplary micromirror device in which embodiments of the invention are applicable is illustrated therein. Micromirror device 210 comprises substrate 120 that is a light transmissive substrate such as glass or quartz and semiconductor substrate 122. Deflectable and reflective mirror plate 212 is spaced apart and attached to deformable hinge 214 via a hinge contact. The deformable hinge is affixed to and held by posts 188. The semiconductor substrate has addressing electrode 216 for deflecting the mirror plate. In this particular example, the light transmissive substrate operates as a stopper for stopping the rotation of the mirror plate at the ON state.

Figure 9:
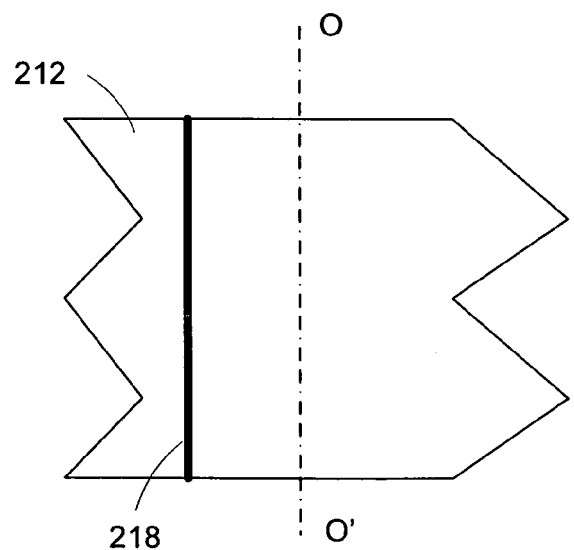
FIG. 9 is a top view of the mirror plate in FIG. 8.

A top view of the micromirror in FIG. 8 is illustrated in FIG. 9. As can be seen in FIG. 9, deformable hinge 218 is not along but offset from the symmetrical axis OO' of the mirror plate such that the mirror plate is operable to rotate asymmetrically. The deformable hinge is located beneath the mirror plate in the direction of the incident light. That is, the mirror plate is located between the light transmissive substrate and the deformable hinge such that the deformable hinge is not illuminated by the incident light so as to prevent unexpected light scattering from the deformable hinge, thereby, increasing the contrast ratio of the produced image. The quality of the produced image is further improved through reduction of the light scattering from the edges of the mirror plate by forming the edges of the mirror plate into zigzagged shape, as shown in the figure.

The deflectable and reflective mirror plate can be a multilayered structure. For example, the mirror plate may comprise an electrical conducting layer, a reflective layer that is capable of reflecting 85% or more, or 90% or more, or 85% or more, or 99% or more of the incident light (e.g. incident visible light), a mechanical enhancing layer that enhances the mechanical properties of the mirror plate. For example, the mirror plate may comprise a $SiO_2$ layer, an aluminum layer, a titanium layer, and a titanium nitride layer. When the aluminum layer is to be deposited on the $SiO_2$ layer, diffusion between the aluminum layer and $SiO_x$ layer may occur. This can be avoided by depositing a barrier layer therebetween.

Figure 10:
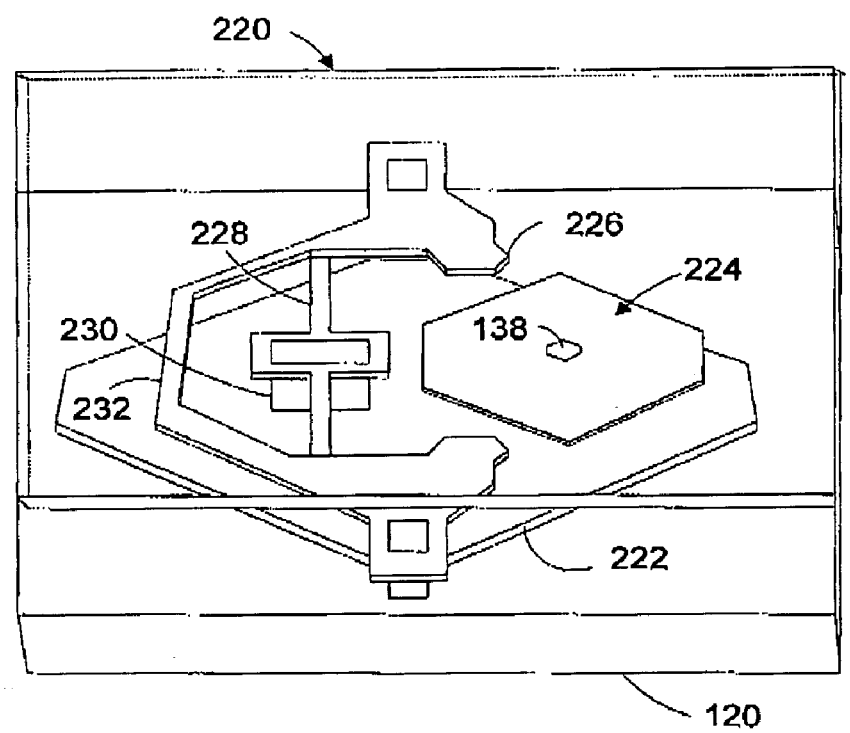
FIG. 10 is an exemplary micromirror device of the micromirror array device in FIG. 3 according to an embodiment of the invention.

Another exemplary micromirror device having a cross-sectional view of FIG. 3 is illustrated in its perspective view in FIG. 10. Referring to FIG. 10, deflectable reflective mirror plate 222 with a substantially square shape is formed on light transmissive substrate 120, and is attached to deformable hinge 228 via hinge contact 230. The deformable hinge is held by hinge support 232, and the hinge support is affixed and held by posts on the light transmissive substrate. For electrostatically deflecting the mirror plate, an addressing electrode (not shown in the figure for simplicity purposes) is fabricated in the semiconductor substrate 122. For improving the electrical coupling of the deflectable mirror plate to the electrostatic field, extending metallic plate 224 can be formed on the mirror plate and contacted to the mirror plate via post 138.

Figure 11:
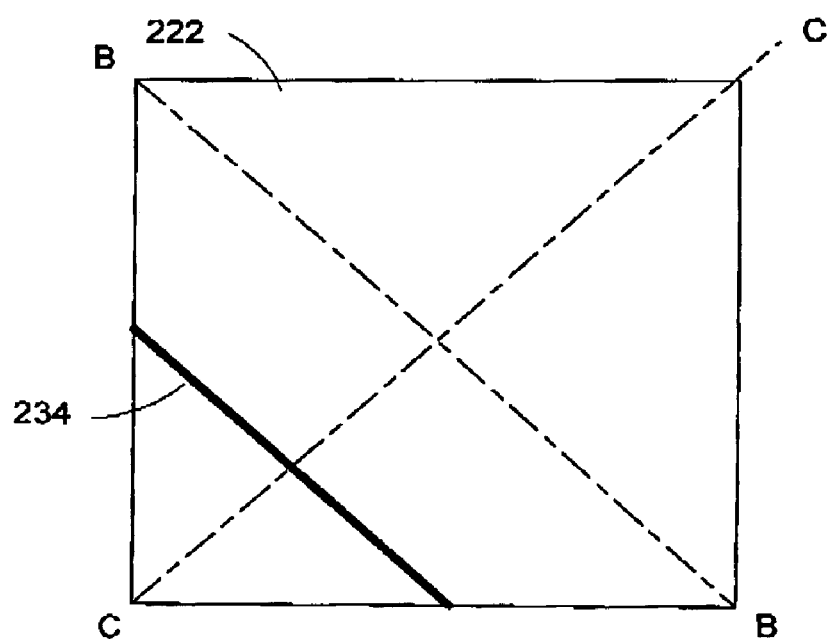
FIG. 11 is a top view of the mirror plate in FIG. 10.

The mirror plate is preferably attached to the deformable hinge asymmetrically such that the mirror plate can be rotated asymmetrically in favor of high contrast ratio. The asymmetric attachment is better illustrated in FIG. 11. Referring to FIG. 11, mirror plate comprises diagonals BB and CC. Deformable hinge is disposed with its length parallel to a diagonal (e.g. BB) of the mirror plate. However, the length of the deformable is not along any diagonal of the mirror plate in the top view when the mirror plate is parallel to the light transmissive substrate. Of course, the mirror plate can be attached to the deformable hinge symmetrically by placing the attachment point around the geometric or mass center of the mirror plate, which will not be discussed in detail herein.

Similar to that in FIG. 8, the deformable hinge is preferably formed beneath the deflectable mirror plate in the direction of the incident light so as to avoid unexpected light scattering by the deformable hinge. For reducing unexpected light scattering of the mirror plate edge, the illumination light is preferably incident onto the mirror plate along a corner of the mirror plate.

Figure 12:
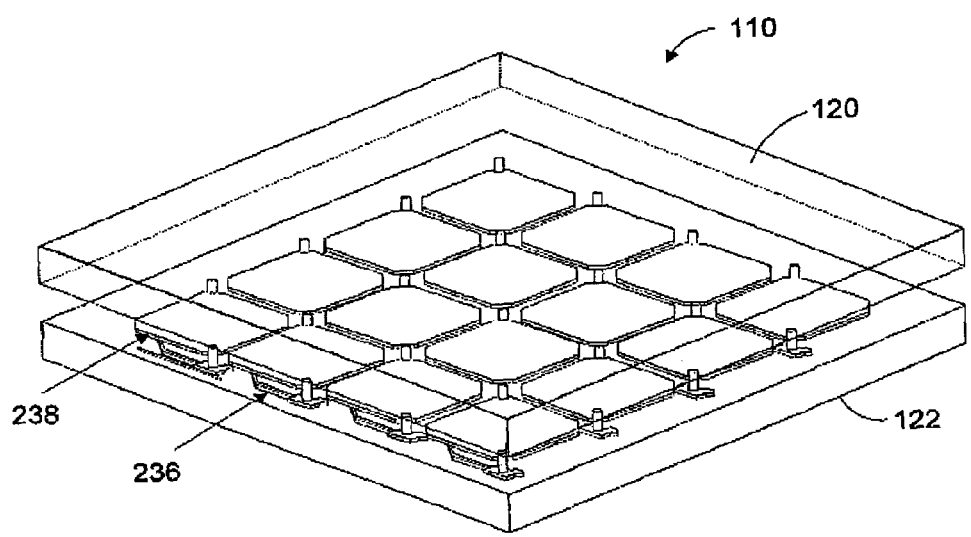
FIG. 12 is a perspective view of a portion of the spatial light modulator in FIG. 2.

Referring to FIG. 12, an exemplary spatial light modulator having an array of micromirrors of FIG. 10 is illustrated therein. For simplicity purposes, only 4×4 micromirrors are presented. In this example, micromirror array 238 is formed on light transmissive substrate 120; and addressing electrode and circuitry array 236 is formed on semiconductor substrate 122 for deflecting the micromirrors in the micromirror array. The deformable hinges of the micromirrors, as well as the addressing electrodes are hidden from the incident light.

Figure 13:
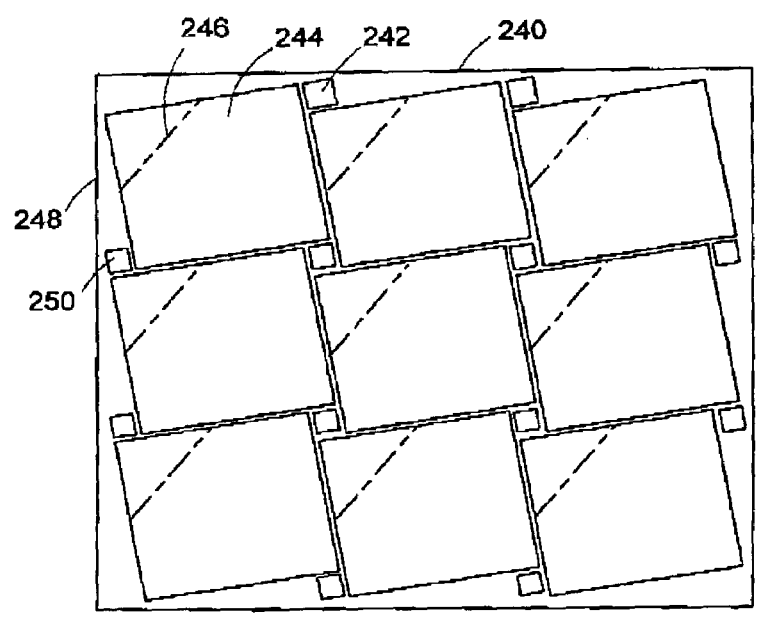
FIG. 13 is a top view of another exemplary spatial light modulator in FIG. 2.

The micromirrors in the micromirror array of the spatial light modulator can be arranged in alternative ways, another one of which is illustrated in FIG. 13. Referring to FIG. 13, each micromirror is rotated around its geometric center an angle less than 45° degrees. The posts (e.g. 242 and 250) of each micromirror (e.g. mirror 244) are then aligned to the opposite edges of the mirror plate. No edges of the mirror plate are parallel to an edge (e.g. edges 240 or 248) of the micromirror array. The rotation axis (e.g. axis 246) of each mirror plate is parallel to but offset from a diagonal of the mirror plate when viewed from the top of the mirror plate at a non-deflected state.

Figure 14:
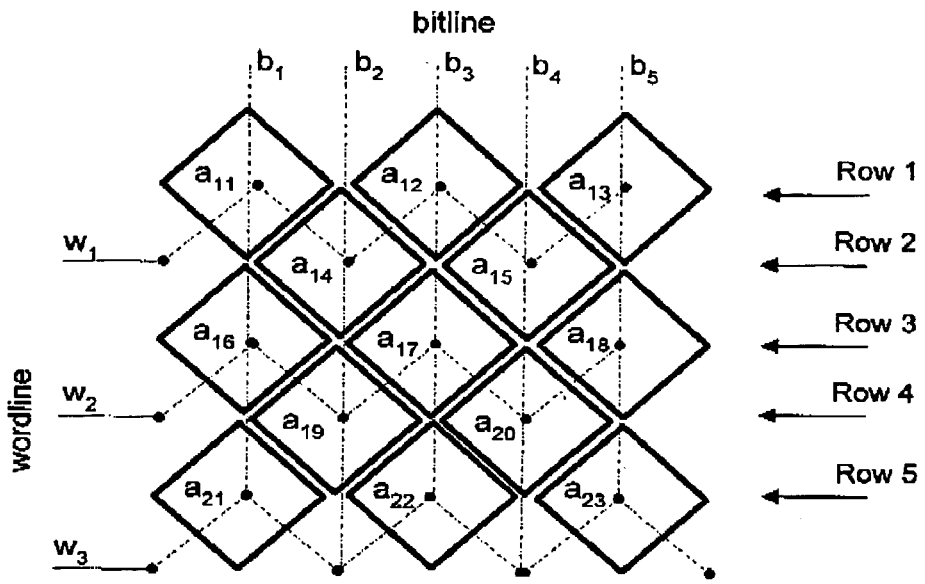
FIG. 14 is a top view of yet another exemplary spatial light modulator in FIG. 2.

FIG. 14 illustrates the top view of another micromirror array having an array of micromirrors of FIG. 8. In this example, each micromirror is rotated 45° degrees around its geometric center. For addressing the micromirrors, the bitlines and wordlines are deployed in a way such that each column of the array is connected to a bitline but each wordline alternatively connects micromirrors of adjacent rows. For example, bitlines $b_1$, $b_2$, $b_3$, $b_4$, and $b_5$ respectively connect micromirrors groups of ($a_{11}$, $a_{16}$, and $a_{21}$), ($a_{14}$ and $a_{19}$), ($a_{12}$, $a_{17}$, and $a_{22}$), ($a_{15}$ and $a_{20}$), and ($a_{13}$, $a_{18}$, and $a_{23}$). Wordlines $w_1$, $w_2$, and $W_3$ respectively connect micromirror groups ($a_{11}$, $a_{14}$, $a_{12}$, $a_{15}$, and $a_{13}$), ($a_{16}$, $a_{19}$, $a_{17}$, $a_{20}$, and $a_{18}$), and ($a_{21}$, $a_{22}$, and $a_{23}$). With this configuration, the total number of wordlines is less the total number of bitlines.

Figure 15:
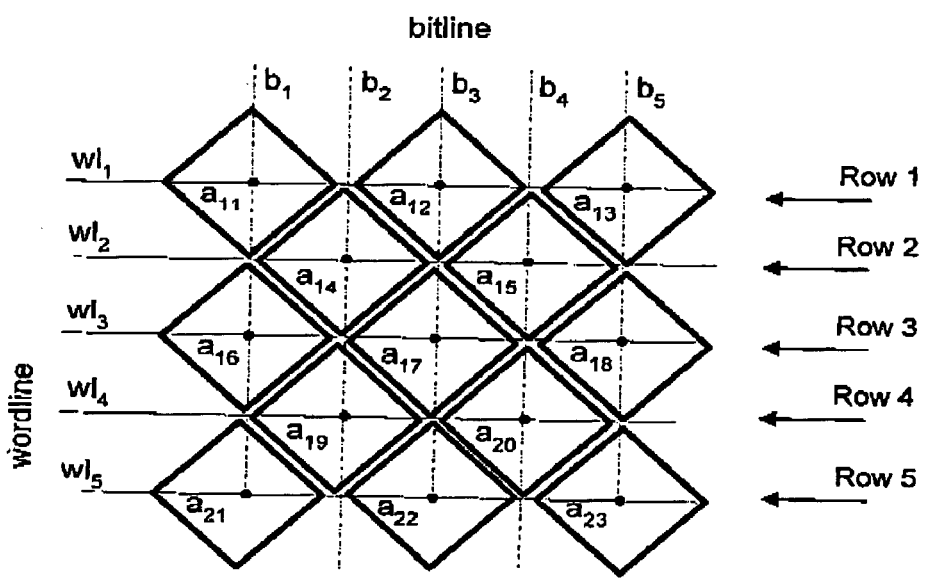
FIG. 15 is a top view of yet another exemplary spatial light modulator in FIG. 2.

For the same micromirror array, the bitlines and wordlines can be deployed in other ways, such as that shown in FIG. 15. Referring to FIG. 15, each row of micromirrors is provided with one wordline and one bitline. Specifically, bitlines $b_1$, $b_2$, $b_3$, $b_4$ and $b_5$ respectively connect column 1

(comprising micromirrors $a_{11}$, $a_{16}$, and $a_{21}$), column 2 (comprising micromirrors $a_{14}$ and $a_{19}$), column 3 (comprising micromirrors $a_{12}$, $a_{17}$, and $a_{22}$), column 4 (comprising micromirrors $a_{15}$ and $a_{20}$), and column 5 (comprising micromirrors $a_{13}$, $a_{18}$, and $a_{23}$). Wordlines $WL_1$, $WL_2$, $WL_3$, $WL_4$, and $WL_5$ respectively connect row 1 (comprising micromirrors $a_{11}$, $a_{12}$, and $a_{13}$), row 2 (comprising micromirrors $a_{14}$ and $a_{15}$), row 3 (comprising micromirrors $a_{16}$, $a_{17}$, and $a_{18}$), row 4 (comprising micromirrors $a_{19}$ and $a_{20}$) and row 5 (comprising micromirrors $a_{21}$, $a_{22}$, and $a_{23}$).

Figure 16A:
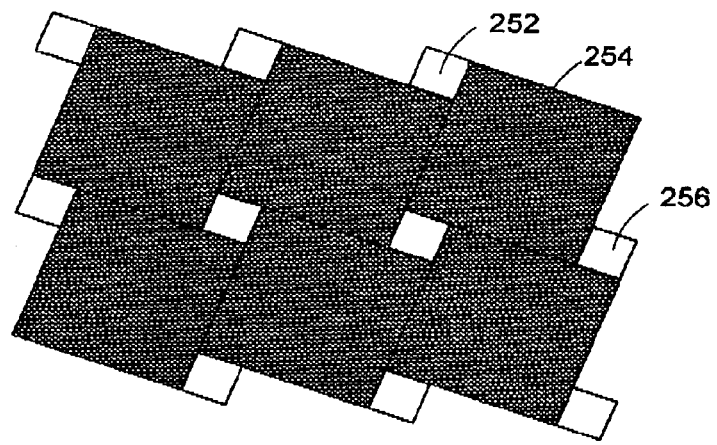
FIGS. 16a to 16c schematically show a top view of another exemplary micromirror array device comprising an array of electrodes and circuitry and micromirrors.
Figure 16B:
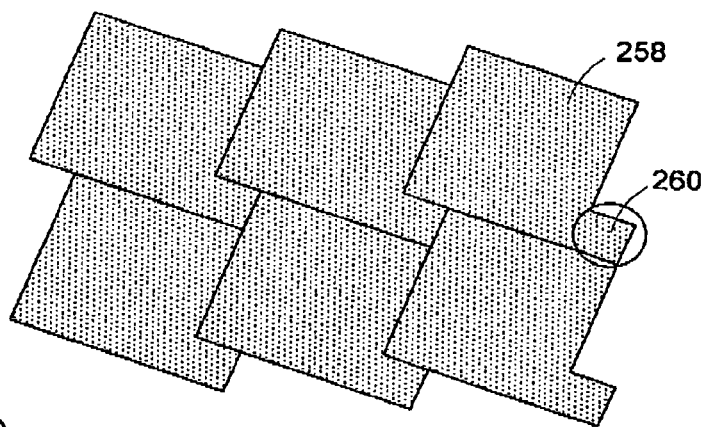
Figure 16C:
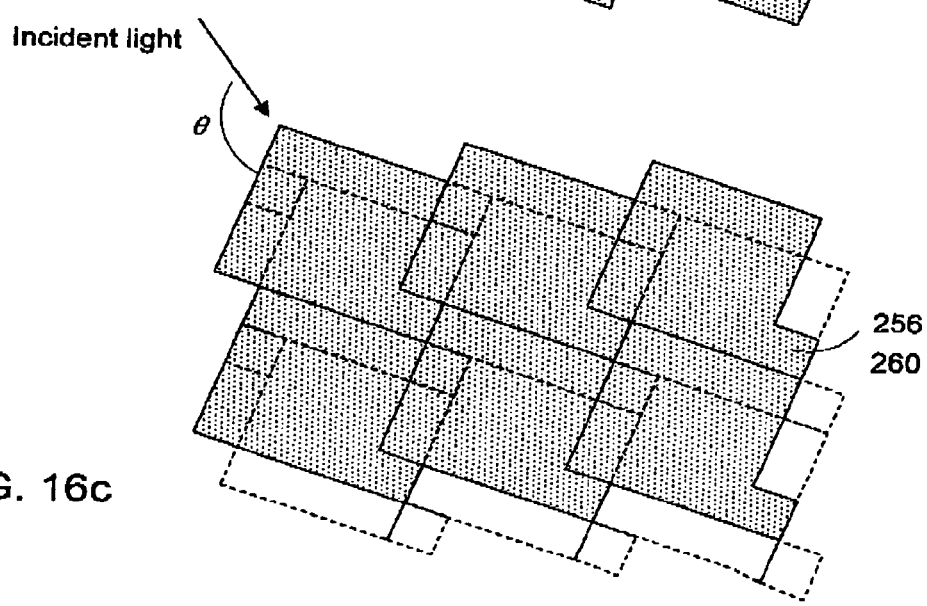

According to another embodiment of the invention, the mirror plates of the micromirrors in the array can form a plurality of pockets, in which posts can be formed, wherein the pockets are covered by the extended areas of the addressing electrodes when viewed from the top of the micromirror array device, as shown in FIGS. 16a to 16c.

Referring to FIG. 16a, a portion of an array of mirror plates of the micromirrors is illustrated therein. The mirror plates in the array form a plurality of pockets in between. For example, pockets 252 and 256 are formed in which posts for supporting and holding mirror plate 254 can be formed. For individually addressing and deflecting the mirror plates, an array of addressing electrodes is provided, a portion of which is illustrated in FIG. 16b.

Referring to FIG. 16b, each addressing electrode has an extended portion, such as extended portion 260 of addressing electrode 258. Without the extended portion, the addressing electrode can be generally square, but having an area equal to or smaller than the mirror plate.

FIG. 16c illustrates a top view of a micromirror array device after the addressing electrodes in FIG. 16b and the mirror plates in FIG. 16a that are assembled together. It can be seen in the figure that each addressing electrode is displaced a particular distance along a diagonal of the mirror plate associated with the addressing electrode. As a result, the pockets presented between the mirror plates are covered by the addressing electrode, specifically by the extended portions of the addressing electrodes. In this way, light scattering otherwise occurred in the substrate having the addressing electrodes can be removed. The quality, such as the contrast ratio of the displayed images can be improved.

When used in a spatial light modulator of a display system as shown in FIG. 1, the incident light beam is directed onto the mirror plates in a direction along the displacement direction of the addressing electrodes when viewed from the top of the addressing electrodes as shown in the figure. For example, the incident light has an angle θ to an edge of the addressing electrode (or the mirror plate) when viewed from the top; and the angle can be 135° degrees.

The micromirrors in which embodiments of the invention can be implemented may be composed of any suitable materials and fabricated in many ways. According to the invention, the deflectable mirror plate comprises reflective film, preferably composed of a metallic material (e.g. aluminum, gold, silver) having a high reflectivity, deposited on another non-metallic material, such as $SiO_x$, $SiN_x$ and $TiN_x$ for enhancing the mechanical properties of the mirror plate. Alternatively, other materials, such as a barrier layer for preventing diffusion between the metallic reflecting layer and the mechanical enhancing layer, can be deposited between the metallic reflecting layer and the mechanical enhancing layer.

The deformable hinge preferably comprises an electrically conductive layer. Examples of suitable materials for the hinge layer are Al, Ir, titanium, titanium nitride, titanium oxide(s), titanium carbide, $TiSiN_x$, $TaSiN_x$, or other ternary and higher compounds.

It will be appreciated by those skilled in the art that a new and useful method and apparatus for transposing pixel data matrices into bitplane data matrices for use in display systems having micromirror arrays have been described herein. In view of many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. Therefore, the invention as described herein contemplates all such embodiments as may come within the scope of the following claims and equivalents thereof. In the claims, only elements denoted by the words "means for" are intended to be interpreted as means plus function claims under 35 U.S.C. §112, the sixth paragraph.

It will be appreciated by those of skill in the art that a new and useful micromirror array device having multiple device substrates that are bonded together has been described herein, wherein the bonding is accomplished with a boning agent that comprises an electrically conductive adhesive material. In view of many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. Therefore, the invention as described herein contemplates all such embodiments as may come within the scope of the following claims and equivalents thereof.

We claim:

1. A micromirror array device, comprising:
   first and second substrates bonded together so as to form a gap therebetween;
   an array of deflectable reflective mirror plates disposed within the gap;
   a first electrical contact on the first substrate;
   a second electrical contact on the second substrate;
   wherein the first and second electrical contacts are electrically contacted within the gap;
   a third electrical contact on the first substrate;
   a fourth electrical contact on the second substrate;
   wherein the third and fourth electrical contacts are electrically contacted within the gap;
   wherein the first electrical contact is connected to the mirror plates; and
   wherein the third electrical contact is connected to a light transmissive electrode on the first substrate.

2. The device of claim 1, wherein the first and second electrical contacts comprise a conductive adhesive material.

3. The device of claim 2, wherein the first and second substrates are bonded with the conductive adhesive material.

4. The device of claim 2, wherein the conductive adhesive material has a low outgassing.

5. The device of claim 2, wherein the conductive adhesive comprises an electrically conductive epoxy.

6. The device of claim 5, wherein the conductive epoxy comprises an epoxy doped with an electrically conductive material.

7. The device of claim 6, wherein the electrically conductive material is a metal element.

8. The device of claim 6, wherein the metal element is silver.

9. The device of claim 6, wherein the metal element is gold.

10. The device of claim 6, wherein the metal element is carbon.

11. The device of claim 6, wherein the electrically conductive material is a metalloid.

12. The device of claim 6, wherein the electrically conductive material is an intermetallic compound.

13. The device of claim 6, wherein the electrically conductive material is a conductive organic material.

14. The device of claim 6, wherein the electrically conductive material is a conductive polymer.

15. The device of claim 6, wherein the electrically conductive material comprises a carbide of a material that is selected from the group consisting of: a metal element, a metalloid, an intermetallic compound, and a ceramic.

16. The device of claim 6, wherein the epoxy is an IR curable epoxy.

17. The device of claim 6, wherein the epoxy is an UV curable epoxy.

18. The device of claim 1, wherein the first electric contact is connected to the mirror plates.

19. The device of claim 18, wherein the second substrate comprises a set of electric contacting pads on a ledge of the second substrate for connection to external power sources and signal sources, at least one of said electric contacting pads is connected to the second electrical contact.

20. The device of claim 19, wherein the contacting pads on the second substrate are connected to another set of electrical contacting pads on a package substrate having a supporting surface on which the device is disposed.

21. The device of claim 1, wherein the first and second substrates are bonded together with a sealing ring disposed around a circumference of the first or second substrate; and wherein the first and second electrical contacts are enclosed within the sealing ring.

22. The device of claim 1, wherein the first and second electrical contacts on the first and second substrates are located outside an area in which the array of mirror plates are disposed.

23. The device of claim 1, wherein the first substrate is transmissive to the visible light; and wherein the second substrate is a semiconductor substrate.

24. The device of claim 23, wherein the mirror plates are formed on the light transmissive substrate.

25. The device of claim 24, wherein each mirror plate is associated with one single addressing electrode for being addressed and deflected.

26. The device of claim 24, further comprising:
an electrode on the second substrate for moving one of the mirror plate towards the second substrate; and
another electrode on the first substrate for rotating the mirror plate towards the first substrate.

27. The device of claim 24, wherein each mirror plate is attached to a deformable hinge such that the mirror plate is operable to rotate relative to the first substrate.

28. The device of claim 27, wherein the mirror plate and deformable hinge are disposed on separate planes that are spaced apart in a direction perpendicular to the first substrate when the mirror plate is not deflected.

29. The device of claim 27, wherein the mirror plate and deformable hinge are disposed on the same plane.

30. The device of claim 1, wherein the mirror plates are formed on the second substrate one which an array of addressing electrodes is formed.

31. The device of claim 1, further comprising: an array of addressing electrodes for moving the mirror plates, wherein the addressing electrodes are electrically connected to the second electrical contacting pad on the second substrate.

32. A microelectromechanical device, comprising:
first and second substrates bonded together so as to form a gap therebetween;
an array of microelements disposed within the gap;
a first electrical contact on the first substrate;
a second electrical contact disposed on the second substrate;
wherein the first and second electrical contacts are electrically contacted within the gap;
a third electrical contact on the first substrate;
a fourth electrical contact on the second substrate;
wherein the third and fourth electrical contacts are electrically contacted within the gap;
wherein the first electrical contact is connected to the mirror plates; and
wherein the third electrical contact is connected to a light transmissive electrode on the first substrate.

33. The device of claim 32, wherein the microelements are electrostatically deflectable elements.

34. The device of claim 33, wherein the microelements are deflectable reflective mirror plates.

35. The device of claim 34, wherein the mirror plates are formed on the first substrate that is transmissive to visible light.

36. The device of claim 32, wherein the first substrate is bonded to the second substrate via a packaging substrate having a supporting surface on which the second substrate is disposed.

37. The device of claim 36, wherein the mirror plates are formed on the second substrate.

38. The device of claim 36, wherein the mirror plates are derived from a single crystal.

39. The device of claim 32, wherein the first and second contacts are an electrically conductive adhesive.

40. The device of claim 39, wherein the adhesive comprises an epoxy.

41. The device of claim 40, wherein the epoxy is filled with an electrically conductive material.

42. The device of claim 41, wherein the conductive material is selected from the group consisting of; a metal element, a metalloid, an intermetallic material, an ceramic, organic material and a polymer.

43. The device of claim 41, wherein the conductive material comprises a carbon.

44. The device of claim 41, wherein the conductive material comprises a carbide of a material selected from a group consisting of a metal element, a metalloid, an intermetallic material, an ceramic, organic material and a polymer.

45. The device of claim 32, wherein the first contact on the first substrate is connected to the mirror plates.

* * * * *